United States Patent
Kammler et al.

(10) Patent No.: US 7,122,410 B2
(45) Date of Patent: Oct. 17, 2006

(54) POLYSILICON LINE HAVING A METAL SILICIDE REGION ENABLING LINEWIDTH SCALING INCLUDING FORMING A SECOND METAL SILICIDE REGION ON THE SUBSTRATE

(75) Inventors: Thorsten Kammler, Ottendorf-Okrilla (DE); Karsten Wieczorek, Dresden (DE); Matthias Schaller, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 416 days.

(21) Appl. No.: 10/790,974

(22) Filed: Mar. 2, 2004

(65) Prior Publication Data
US 2005/0026379 A1    Feb. 3, 2005

(30) Foreign Application Priority Data
Jul. 31, 2003  (DE) ................... 103 35 101

(51) Int. Cl.
  *H01L 21/84*  (2006.01)
  *H01L 21/4763*  (2006.01)
  *H01L 21/44*  (2006.01)

(52) U.S. Cl. .............. 438/154; 438/649; 438/651; 438/656; 438/682

(58) Field of Classification Search ............... 438/154, 438/649, 651, 656, 682
See application file for complete search history.

(56) References Cited

U.S. PATENT DOCUMENTS

| | | | |
|---|---|---|---|
| 5,731,239 A | 3/1998 | Wong et al. | 438/296 |
| 5,953,612 A | 9/1999 | Lin et al. | 438/299 |
| 6,153,485 A | 11/2000 | Pey et al. | 438/305 |
| 6,376,320 B1 | 4/2002 | Yu | 438/303 |
| 6,458,678 B1 | 10/2002 | Spikes, Jr. et al. | 438/592 |
| 6,867,130 B1* | 3/2005 | Karlsson et al. | 438/655 |
| 2004/0084734 A1* | 5/2004 | Matsuo | 257/407 |

* cited by examiner

*Primary Examiner*—William M. Brewster
(74) *Attorney, Agent, or Firm*—Williams, Morgan & Amerson, P.C.

(57) ABSTRACT

By maintaining the gate electrode covered during the process flow for forming metal silicide regions in the drain and source of a field effect transistor, an appropriate metal silicide may be formed on the gate electrode which meets the requirement for aggressive gate length scaling. Preferably, a nickel silicide is formed on the gate electrode, whereas the drain and source regions receive the well-established cobalt disilicide. Additionally, the gate electrode dopant profile is effectively decoupled from the drain and source dopant profile.

24 Claims, 6 Drawing Sheets

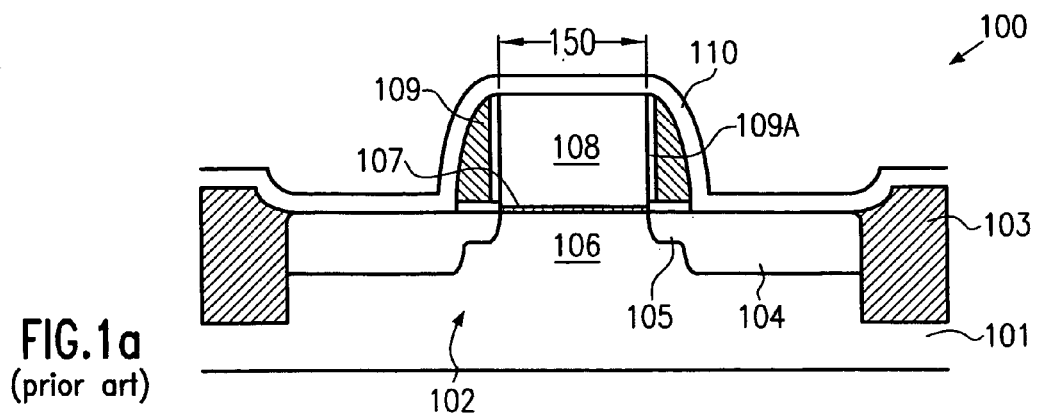
FIG.1a
(prior art)
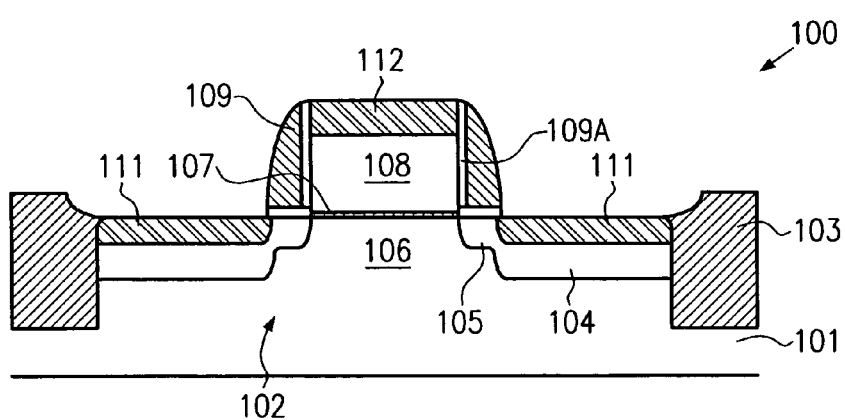
FIG.1b
(prior art)
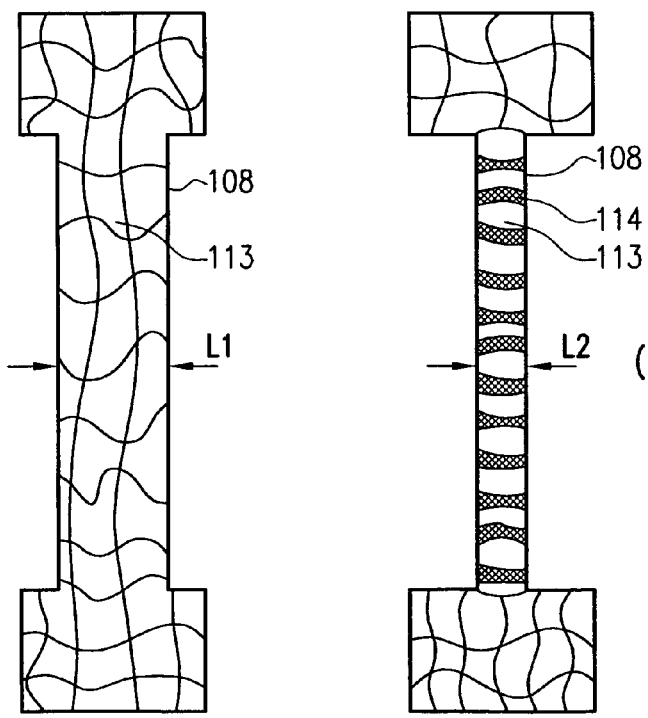
FIG.1c
(prior art)
FIG.1d
(prior art)

POLYSILICON LINE HAVING A METAL SILICIDE REGION ENABLING LINEWIDTH SCALING INCLUDING FORMING A SECOND METAL SILICIDE REGION ON THE SUBSTRATE

BACKGROUND OF THE INVENTION

1. Field of the Invention

Generally, the present invention relates to the fabrication of integrated circuits, and, more particularly, to the formation of metal silicide regions on silicon-containing conductive circuit elements to decrease a sheet resistance thereof.

2. Description of the Related Art

In modern ultrahigh density integrated circuits, device features are steadily decreasing to enhance device performance and functionality of the circuit. Shrinking the feature sizes, however, entails certain problems that may partially offset the advantages obtained by reducing the feature sizes. Generally, reducing the size of, for example, a transistor element such as a MOS transistor, may lead to superior performance characteristics due to a decreased channel length of the transistor element, resulting in a higher drive current capability and enhanced switching speed. Upon decreasing the channel length of the transistor elements, however, the electrical resistance of conductive lines and contact regions, i.e., of regions that provide electrical contact to the periphery of the transistor elements, becomes a major issue since the cross-sectional area of these lines and regions is also reduced. The cross-sectional area, however, determines, in combination with the characteristics of the material comprising the conductive lines and contact regions, the effective electrical resistance thereof.

Moreover, a higher number of circuit elements per unit area also requires an increased number of interconnections between these circuit elements, wherein, commonly, the number of required interconnects increases in a non-linear manner with the number of circuit elements so that the available real estate for interconnects becomes even more limited.

The majority of integrated circuits are based on silicon, that is, most of the circuit elements contain silicon regions, in crystalline, polycrystalline and amorphous form, doped and undoped, which act as conductive areas. An illustrative example in this context is a gate electrode of a MOS transistor element, which may be considered as a polysilicon line. Upon application of an appropriate control voltage to the gate electrode, a conductive channel is formed at the interface of a thin gate insulation layer and an active region of the semiconducting substrate. Although reducing the feature size of a transistor element improves device performance due to the reduced channel length, the shrinkage of the gate electrode (in the gate length direction), however, may result in significant delays in the signal propagation along the gate electrode, i.e., the formation of the channel along the entire extension (in the gate width direction which is into the drawing page) of the gate electrode. The issue of signal propagation delay is even exacerbated for polysilicon lines connecting individual circuit elements or different chip regions. Therefore, it is extremely important to improve the sheet resistance of polysilicon lines and other silicon-containing contact regions to allow further device scaling without compromising device performance. For this reason, it has become standard practice to reduce the sheet resistance of polysilicon lines and silicon contact regions by forming a metal silicide in and on appropriate portions of the respective silicon-containing regions.

With reference to FIGS. 1a–1d, a typical prior art process flow for forming metal silicide on a corresponding portion of a MOS transistor element will now be described as an illustrative example for demonstrating the reduction of the sheet resistance of silicon.

FIG. 1a schematically shows a cross-sectional view of a transistor element 100, such as a MOS transistor that is formed on a substrate 101 including a silicon-containing active region 102. The active region 102 is enclosed by an isolation structure 103, which in the present example is provided in the form of a shallow trench isolation usually used for sophisticated integrated circuits. Highly doped source and drain regions 104 including extension regions 105 are formed in the active region 102. The source and drain regions 104 including the extension regions 105 are laterally separated by a channel region 106. A gate insulation layer 107 electrically and physically isolates a gate electrode 108 from the underlying channel region 106. Spacer elements 109, including a liner oxide 109A, are formed on sidewalls of the gate electrode 108. A refractory metal layer 110 is formed over the transistor element 100 with a thickness required for the further processing in forming metal silicide portions.

A typical conventional process flow for forming the transistor element 100, as shown in FIG. 1a, may include the following steps. After defining the active region 102 by forming the shallow trench isolations 103 by means of advanced photolithography and etch techniques, well-established and well-known implantation steps are carried out to create a desired dopant profile in the active region 102 and the channel region 106.

Subsequently, the gate insulation layer 107 and the gate electrode 108 are formed by sophisticated deposition, photolithography and anisotropic etch techniques to obtain a desired gate length, which is the horizontal extension of the gate electrode 108, as indicated by the double arrow 150 in FIG. 1a, i.e., in the plane of the drawing of FIG. 1a. Thereafter, a first implant sequence may be carried out to form the extension regions 105 wherein, depending on design requirements, additional so-called halo implants may be performed.

Next, the liner oxide 109A is formed by an advanced oxidation process to serve as an etch stop layer for the subsequent formation of the spacer elements 109. The spacer elements 109 are then formed by depositing a dielectric material, such as silicon dioxide and/or silicon nitride, and patterning the dielectric material by an anisotropic etch process. Thereafter, a further implant process may be carried out to form source and drain regions 104, followed by anneal cycles to activate the dopants and at least partially cure lattice damage created during the implantation cycles.

Subsequently, the refractory metal layer 110 is deposited on the transistor element 100 by, for example, chemical vapor deposition (CVD) or physical vapor deposition (PVD). Preferably, a refractory metal such as titanium, cobalt, and the like is used for the metal layer 110. It turns out, however, that the characteristics of the various refractory metals during the formation of a metal silicide, and afterwards in the form of a metal silicide, significantly differ from each other. Consequently, selecting an appropriate metal depends on further design parameters of the transistor element 100 as well as on process requirements in following processes. For instance, titanium is frequently used for forming a metal silicide on the respective silicon-containing portions. However, the electrical properties of the resulting titanium silicide strongly depend on the dimensions of the transistor element 100. Titanium silicide tends to agglomerate at grain boundaries of polysilicon and therefore may increase the total electrical resistance, wherein this effect is pronounced with decreasing feature sizes so that the use of titanium may not be acceptable for polysilicon lines, such as the gate electrode 108 having a lateral dimension, i.e., a gate length, of 0.2 μm and less.

For circuit elements having feature sizes of this order of magnitude, cobalt is preferably used as a refractory metal, since cobalt does not substantially exhibit a tendency for blocking grain boundaries of the polysilicon. In the further description of the conventional process flow, it is therefore assumed that the metal layer 110 is comprised of cobalt so as to allow the formation of the transistor element 100 as a sophisticated device having a gate length much less than 0.2 μm.

A first anneal cycle is performed to initiate a reaction between the cobalt in the layer 110 and the silicon in the drain and source regions 104 and the polysilicon in the gate electrode 108. Optionally, a titanium nitride layer having a thickness in the range of approximately 10–20 nm may be deposited above the refractory metal layer 110 prior to annealing the substrate 101 to decrease the finally obtained sheet resistance of the cobalt disilicide by reducing an oxidation of cobalt in the subsequent anneal cycles. Typically, the anneal temperature may range from approximately 450–550° C. to produce cobalt monosilicide. Thereafter, non-reacted cobalt is selectively etched away and then a second anneal cycle is performed with a higher temperature of approximately 700° C. to convert cobalt monosilicide into cobalt disilicide.

FIG. 1b schematically shows the transistor element 100 with cobalt disilicide regions 111 formed on the drain and source region 104 and a cobalt disilicide region 112 on the gate electrode 108. Although cobalt may successfully be used for feature sizes of approximately 0.2 μm and even less, it turns out that, for further device scaling, requiring a gate length of well less than 100 nm, the sheet resistance of the cobalt disilicide enhanced gate electrode 108 increases more rapidly than would be expected by merely taking into account the reduced feature size of the gate electrode 108. It is believed that the increase of the resistivity of the region 112 is caused by tensile stress between individual cobalt disilicide grains, thereby significantly affecting the film integrity of the cobalt disilicide when the gate length is of the order of magnitude of a single grain.

FIGS. 1c and 1d schematically represent the situation for the gate electrode 108 having a gate length L1 of approximately 200 nm compared to a gate length L2 of approximately 50 nm. FIG. 1c depicts the gate electrode 108 with the gate length L1, containing a plurality of single grains 113 arranged along the length L1, whereas, as is shown in FIG. 1d, only one single grain 113 is formed across the length L2. While the thermal stress induced during the second anneal cycle in converting cobalt monosilicide into cobalt disilicide may be compensated for by the plurality of grains across the length L1, the single grain formed across the length L2 may not allow efficient absorption of the stress and may cause an interruption of the cobalt disilicide film, as indicated by 114. As a consequence, the sheet resistance of the polysilicon gate electrode is drastically increased, thereby preventing aggressive device scaling without unduly degrading the transistor performance.

Therefore, nickel is frequently considered a viable candidate for replacing cobalt as nickel monosilicide exhibits excellent conductivity substantially without forming stressed grains of a size of 50 nm and less. However, a significant reduction of production yield may be observed that primarily arises from deteriorated transistor performance in the drain and source regions. Without intending to limit the present invention to the following explanation, it is believed that a major issue in forming nickel silicide regions in the drain and source regions is the uncontrolled formation of nickel silicide protrusions that may reach into the PN junction, thereby adversely affecting the transistor operation or even causing a complete failure of the transistor. Hence, simply replacing cobalt with nickel in the above-described process does not seem to be a promising approach.

In view of the above-explained problems, therefore, a need exists for an improved silicide formation technique, enabling further device scaling while not unduly compromising production yield.

SUMMARY OF THE INVENTION

Generally, the present invention is directed to a technique that enables the independent formation of a first metal silicide, such as a nickel silicide, on a polysilicon line, e.g., a polysilicon gate electrode, while a second metal silicide, such as a cobalt disilicide, is formed on doped regions, such as the drain and source regions of field effect transistors, and the dopant concentrations in the gate electrode and the drain/source regions may at the same time be efficiently decoupled, thereby allowing an aggressive gate length scaling without unduly compromising the production yield as the excellent conductivity and manufacturing characteristics of, for example, cobalt disilicide are maintained on the drain and source regions.

According to one illustrative embodiment of the present invention, a method comprises patterning a polysilicon layer formed over a silicon-containing region of a substrate so as to form a polysilicon feature. Then, a first metal silicide region is formed adjacent to the polysilicon feature while a top surface of the polysilicon feature is covered. After forming the first metal silicide, the polysilicon feature is doped. The top surface is then exposed and a second silicide region is formed in the polysilicon feature, wherein the second silicide region is comprised of material other than the first metal silicide region. In other illustrative embodiments, the top surface is covered by a layer or a layer stack used as a bottom anti-reflective layer during the patterning of the polysilicon layer.

According to still a further illustrative embodiment of the present invention, a method of forming a field effect transistor comprises forming a layer stack including at least a gate insulation layer, a polysilicon layer and a cap layer above a silicon region formed on a substrate. The layer stack is then patterned so as to form a gate electrode having a top surface covered at least by the cap layer. Then, drain and source regions are formed adjacent to the gate electrode and silicide regions comprising a first metal are formed in the drain and source regions. After forming the metal silicide regions with the first metal, the gate electrode is doped. Thereafter, the top surface of the gate electrode is exposed and a silicide region comprising a second metal is formed in the gate electrode.

According to still a further illustrative embodiment of the present invention, a field effect transistor comprises a gate electrode formed on a gate insulation layer and a nickel silicide region formed in the gate electrode. Moreover, a drain and a source region are formed adjacent to the gate electrode. Furthermore, the field effect transistor comprises a metal silicide region formed in the drain and the source regions, wherein the metal silicide region is comprised of a metal silicide other than nickel silicide.

BRIEF DESCRIPTION OF THE DRAWINGS

The invention may be understood by reference to the following description taken in conjunction with the accompanying drawings, in which like reference numerals identify like elements, and in which:

FIGS. 1a and 1b schematically show cross-sectional views of a conventional field effect transistor during different stages of manufacture;

FIGS. 1c and 1d schematically show top views of gate electrodes of different gate length, wherein an unduly increased gate resistance may be observed at a gate length of well less than 100 nm;

Figure 2A:
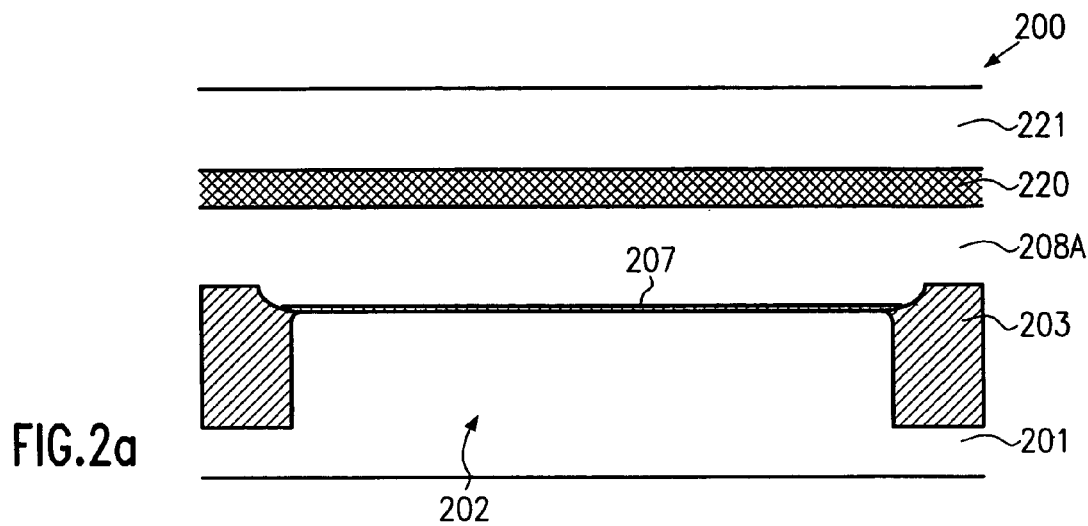
FIGS. 2a–2f schematically show cross-sectional views of a field effect transistor during various manufacturing stages in accordance with illustrative embodiments of the present invention including a cap layer to enable an independent formation of silicide regions in the gate electrode and the drain and source regions.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It should be noted that the present invention is particularly advantageous when applied to the formation of field effect transistors receiving a nickel silicide region on the gate electrode and a cobalt disilicide region on the drain and source areas of the transistor, since, as previously discussed, nickel silicide allows a reduction of linewidth without unduly compromising the silicide film characteristics, whereas cobalt disilicide is an approved and well-established silicide material on silicon-containing regions having lateral dimensions exceeding approximately 100 nm. It may readily be appreciated, however, that at least some of the embodiments disclosed herein may be used to form any metal silicide on the gate electrode and the drain and source regions substantially independently from each other irrespective of the metal used. Consequently, the present invention should not be considered as being limited to the specific nickel silicide and cobalt disilicide materials disclosed herein unless such limitations are explicitly set forth in the appended claims.

With reference to the figures, further illustrative embodiments of the present invention will now be described in more detail. FIG. 2a schematically shows the early stages of fabrication of a silicon-based semiconductor device 200 in the form of a field effect transistor. The semiconductor device 200 comprises a substrate 201, for instance a bulk silicon substrate or an SOI substrate having formed thereon a crystalline silicon region 202, which may also be referred to as an active region. The active region 202 is enclosed by an isolation structure 203 that may be provided in the form of a trench isolation structure as is usually used in sophisticated semiconductor devices. A gate insulation layer 207 having a required thickness and composition is formed above the active region 202 followed by a polysilicon layer 208a having a thickness as is required for a subsequent patterning of a gate electrode. A cover layer 220 is formed on the polysilicon layer 208a followed by a resist layer 221, wherein the cover layer 220 and the resist layer 221 are formed with respect to their thickness and composition so as to meet the restricted requirements of advanced photolithography techniques for patterning feature sizes less than 100 nm. The cover layer 220 may be formed of one or more layers having optical characteristics so as to serve as a bottom anti-reflective coating (BARC) during the subsequent lithography. In one illustrative embodiment, the cover layer 220 is comprised of a silicon nitride layer that may include a certain amount of oxygen, wherein the optical characteristics and the thickness are appropriately selected to suppress back reflection during the deep UV exposure. In other embodiments, the thickness of the cover layer 220, which may be provided in the form of a silicon nitride layer, is selected so as to effectively act as an implantation mask in subsequent implantation cycles, as will be described in more detail later on, while still exhibiting the required optical characteristics during the subsequent lithography. In one illustrative embodiment, a thickness of the cover layer may range from approximately 20–100 nm.

Processes for forming the semiconductor device 200, as shown in FIG. 2a, may comprise well-established techniques, such as lithography, etch techniques and deposition techniques for forming the trench isolation structure 203, followed by advanced oxidation and/or deposition methods for forming the gate insulation layer 207. The deposition of the layers 208a, 220 and 221 is also well established in the art and is not described in further detail herein. The selection of an appropriate thickness for the cover layer 220, while still obtaining a desired optical behavior, may be performed in advance on the basis of well-established process recipes. Thereafter, the resist layer 221 is lithographically patterned, while taking advantage of the optical characteristics of the cover layer 220, so as to form a resist mask, which is then used to pattern the polysilicon layer 208a by advanced anisotropic etch techniques.

In other embodiments, the cover layer 220 may be comprised of one or more layers, wherein a thickness and/or a material composition is selected to reduce ion penetration, especially of boron ions when a P-channel transistor is to be formed. This may reduce deterioration of the gate insulation layer 207, as will be discussed later on.

Figure 2B:
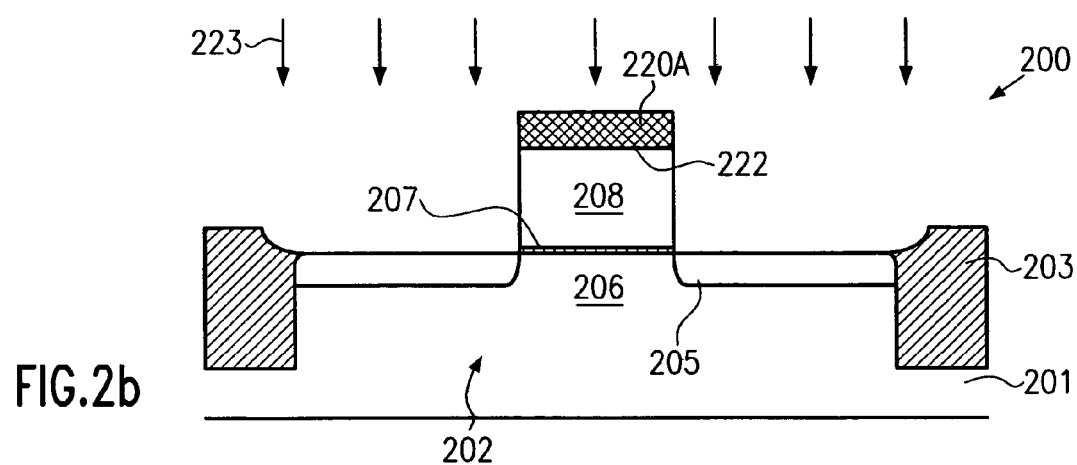

FIG. 2b schematically shows the semiconductor device 200 after completion of the above-described process sequence and the patterning of the gate insulation layer 207. As shown, a gate electrode 208 is formed on the patterned gate insulation layer 207, wherein a top surface 222 of the gate electrode 208 is covered by the remaining cover layer 220 that is now denoted as the cap layer 220a. The semiconductor device 200 is subjected to an ion implantation sequence indicated by reference numeral 223 so as to form extension regions 205 in the active region 202, wherein the extension regions 205 are laterally separated by a channel region 206. It should be noted that the implantation sequence 223 may include a plurality of individual implantation steps to establish the required dopant profile of the extension region 205. For instance, the implantation may include tilted implantation steps with appropriate dopants so as to form the PN junctions connecting to the channel region 206 at a specified location. As previously explained, the cap layer 220a, which may be comprised of, for example, silicon nitride, may effectively reduce the ion penetration of the gate electrode 208, which may be advantageous in forming P-channel transistors when highly diffusive dopants such as boron are implanted to form the extension regions 205. Hence, the implantation may be tailored to the requirements demanded by the dopant profile of the extension regions 205 substantially without affecting the dopant concentration at lower portions of the gate electrode 208 in the vicinity of the gate insulation layer 207.

Figure 2C:
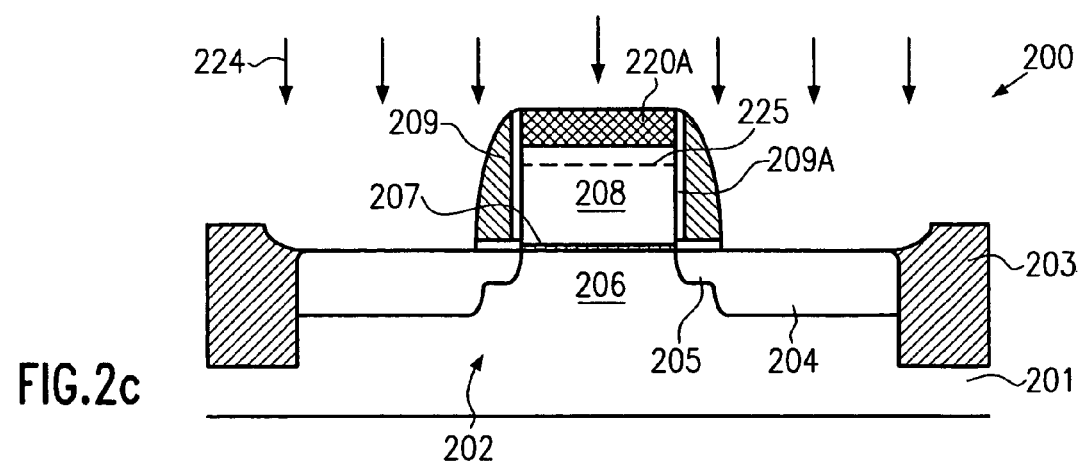

FIG. 2c schematically shows the semiconductor device 200 in a further advanced manufacturing stage. As shown, the semiconductor device 200 comprises sidewall spacers 209, for instance formed of silicon nitride, wherein a liner material 209a, for instance a thermal oxide, may be formed between the sidewall spacers 209 and the gate electrode 208 and the active region 202. The sidewall spacers 209, including the liner material 209a, may be formed in accordance with well-established oxidation and/or deposition and anisotropic etch techniques. Thereafter, the semiconductor device 200 may be subjected to a further implantation cycle, indicated as 224, so as to form drain and source regions 204. Again, the cap layer 220a effectively reduces ion penetration during the implantation 224 so that a maximum peak concentration may be centered at a height 225, thereby enabling the selection of the implantation parameters with respect to the desired dopant profile in the region 204 substantially without affecting the dopant concentration in the gate electrode 208 in the vicinity of the gate insulation layer 207. It should be noted that, in other embodiments, substantially conventional implantation recipes, referring to an exposed top surface 222, may be applied when a thickness of the cap layer 220a, i.e., a thickness of the cover layer 220, is selected sufficiently thin so that the influence of the cap layer 220a is substantially negligible with respect to the dopant profile within the gate electrode 208.

It should further be appreciated that a width of the spacers 209, although their height may vary corresponding to the thickness of the cap layer 220a, is substantially the same irrespective of the thickness of the cap layer 220a as the spacer width is determined by the thickness of the silicon nitride layer deposited to be patterned by anisotropic etching for forming the spacers 209. Consequently, the process sequence is highly compatible with a conventional process, in which a BARC layer may be formed and is removed after patterning the gate electrode 208 and prior to the implantation cycles 223 and 224.

Figure 2D:
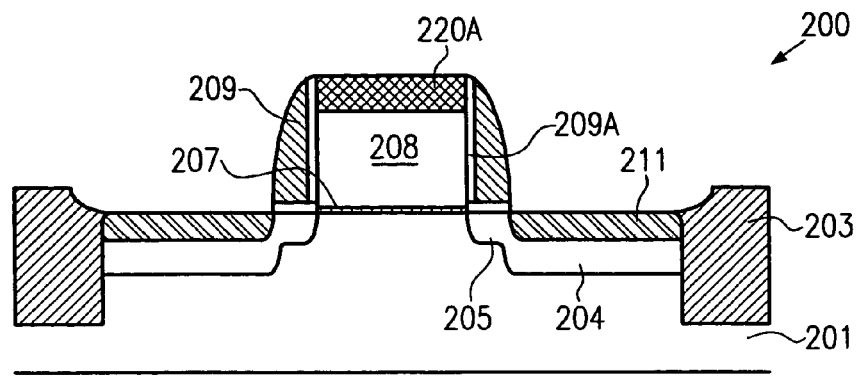

FIG. 2d schematically shows the semiconductor device 200 with metal silicide regions 211 formed in the drain and source regions 204. As previously explained, the metal silicide regions 211 may be comprised of cobalt disilicide due to the excellent electrical characteristics of cobalt disilicide, when a lateral extension of the metal silicide region 211 is well above 100 nm. In other embodiments, different refractory metals, such as titanium and the like, may be used when considered appropriate for specific design criteria.

The metal silicide region 211, for example comprised of cobalt disilicide, may be formed by depositing a cobalt layer, performing a first anneal process to form cobalt monosilicide, removing non-reacted cobalt and performing a second anneal process so as to convert the cobalt monosilicide into cobalt disilicide. During this formation process, the cap layer 220a effectively prevents a chemical reaction of the cobalt with the underlying gate electrode 208. Thereafter, the cap layer 220a is removed by, for instance, an anisotropic etch process, wherein simultaneously the height of the sidewall spacers 209 is correspondingly reduced. The anisotropic etch process may exhibit a certain selectivity to the metal silicide of the regions 211 so as to not unduly affect the characteristics of these regions. In other embodiments, the cap layer 220a may selectively be removed by a wet etch process, for instance on the basis of hot phosphoric acid. In this case, the reduction of spacer width may take place and may be tolerable since relevant transistor characteristics, such as the dopant profile of the regions 204 and 205 as well as the dimensions of the metal silicide region 211, are already defined.

Figure 2E:
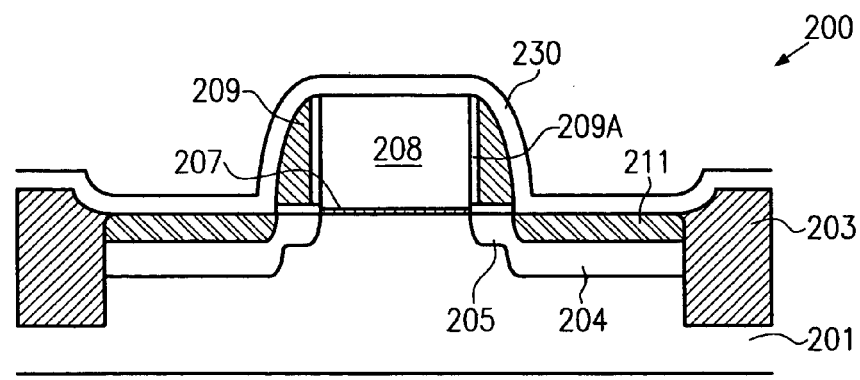

FIG. 2e schematically shows the semiconductor device 200 after the removal of the cap layer 220a with a metal layer 230 formed thereon, wherein, in one particular embodiment, the metal layer 230 is comprised of nickel. Subsequently, the heat treatment is performed at an appropriately low temperature of approximately 350–450° C. so as to form nickel monosilicide on the gate electrode 208. During the chemical reaction of nickel and silicon on the gate electrode 208, the diffusion of nickel into other device regions, especially into the metal silicide region 211 when comprised of cobalt disilicide, is effectively suppressed. Hence, non-reacted nickel may then selectively be removed substantially without affecting other device regions than the gate electrode 208.

Figure 2F:
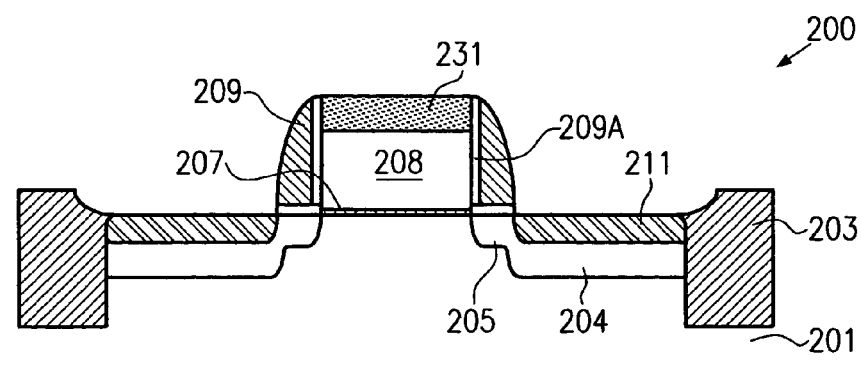

FIG. 2f schematically shows the semiconductor device 200 with a metal silicide region 231 formed on the gate electrode 208, wherein the region 231 is preferably comprised of nickel monosilicide, thereby imparting the gate electrode 208 and, of course, any other polysilicon lines formed simultaneously with the gate electrode 208, a reduced electrical resistance, even at a gate length or linewidth of 100 nm and significantly less, or even 50 nm and less, while the electrical characteristics of the metal silicide region 211 on the drain and source regions may be adjusted independently from that of the gate electrode 208.

As previously pointed out with reference to FIGS. 2b and 2c, the dopant profile within the gate electrode 208 may effectively be modified, depending on the initially selected thickness of the cover layer 220, so that the dopant profiles in the drain and source regions are substantially decoupled from the doping of the gate electrode 208.

With reference to FIGS. 3a–3b and 4a–4f, further illustrative embodiments will now be described in more detail, which in combination with the embodiments described above enable, by performing a separate gate doping step, a substantial decoupling of the respective dopant profiles in combination with an independent formation of the metal silicide regions on the drain and source regions and on the gate electrode, while still offering a high degree of compatibility with the conventional process flow. In FIGS. 3a–3b and 4a–4f, components similar to those described with reference to FIGS. 2a–2f are denoted by identical reference numerals except for the leading digit "2" which is replaced by a "3" and a "4," respectively. A detailed description of these components as well as of processes for forming the same will, therefore, be omitted in the following.

Figure 3A:
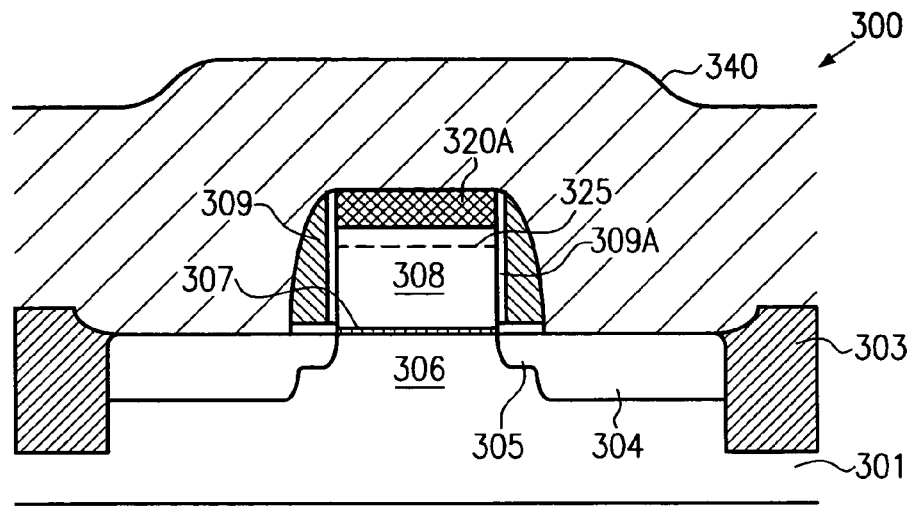
FIGS. 3a and 3b schematically show cross-sectional views of a transistor element, wherein the doping of the gate electrode is decoupled from that of the drain and source regions according to illustrative embodiments of the present invention.

FIG. 3a shows a semiconductor device 300 having a configuration quite similar to that shown in FIG. 2c. Thus, the semiconductor device 300 comprises the gate electrode 308 having a dopant profile 325 as has been created during the implantation cycles for forming the extension region 305 and the drain and source regions 304. As previously explained, the cap layer 320a may be designed so as to effectively suppress ion penetration into lower portions of the gate electrode 308, thereby significantly reducing diffusion of dopants, such as boron, into the gate insulation layer 307 and into the channel region 306 during the anneal cycles for forming the regions 304 and 305. Additionally, the semiconductor device 300 comprises a sacrificial layer 340, which may be comprised of, for example, silicon dioxide. The sacrificial layer 340 may be deposited by chemical vapor deposition in accordance with well-established process recipes. A thickness of the sacrificial layer 340 is selected so as to exceed a height of the gate electrode 308. Subsequently, the sacrificial layer 340 may be planarized by chemical mechanical polishing (CMP), wherein the polish process may be stopped on or in the cap layer 320a.

Figure 3B:
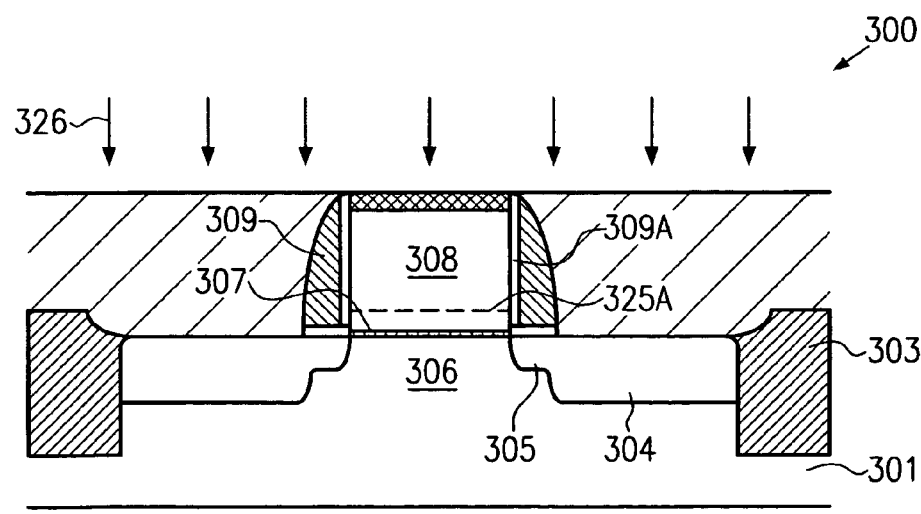

FIG. 3b schematically shows the semiconductor device 300 after completion of the CMP process, wherein, in the embodiment shown in FIG. 3b, the sacrificial layer 340 is planarized and a portion of the cap layer 320a is also removed during the polish process. Since the thickness of the cap layer 320a has been selected to a moderate thickness, for instance, in the range of approximately 20–50 nm, endpoint detection of the CMP process is not critical. As shown, the device 300 is subjected to an implantation sequence 326 that is designed to provide a dopant profile within the gate electrode 308, indicated by 325a, so as to minimize gate electrode depletion while still suppressing dopant penetration into the gate insulation layer 307 and the channel region 306. Thus, doping of the gate electrode 308 and of the active region 302 may substantially be decoupled, thereby allowing specifically designing each doping sequence so as to accomplish an optimized dopant profile.

Subsequently, the sacrificial layer 340 may be removed by a selective anisotropic etch process, during which the liner 309a may also partially be removed, however, at a significantly lower etch rate, due to the small width of the liner 309a and possibly due to a different etch rate compared to the deposited sacrificial layer 340. Thereafter, further processing may be performed as described with reference to FIGS. 2d–2e so as to form cobalt disilicide regions in the drain and source regions 304 and a nickel silicide region in the gate electrode 308. Due to the possibly partially exposed sidewall of the gate electrode 308 owing to a partial liner removal during the anisotropic etch process, cobalt disilicide may also form on upper sidewall portions of the gate electrode 308, which may, however, not negatively influence the nickel silicide formation. In other embodiments, the sacrificial layer 340 may be removed by a selective isotropic etch process, in which a removal rate for the liner 309a is significantly lower compared to the removal rate for the sacrificial layer 340.

In other embodiments, cobalt disilicide regions may be formed on the drain and source regions 304 prior to the deposition of the sacrificial layer 340. The CMP and gate implant may then be performed as described above. During the removal of the sacrificial layer 340, an exposure of sidewall portions of the gate electrode 308 may then advantageously lead to an increased nickel silicide region in the gate electrode.

Figure 4A:
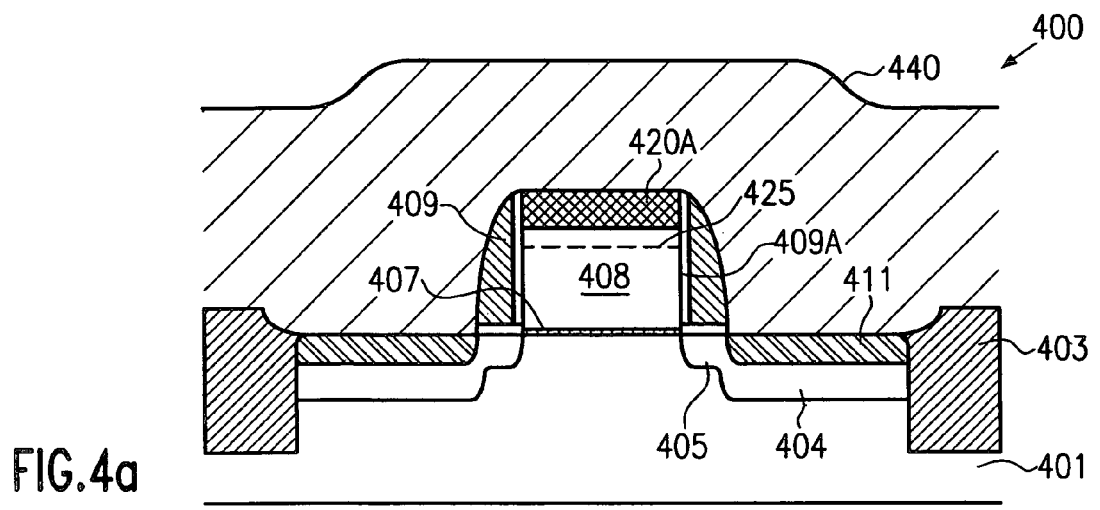
FIGS. 4a–4f schematically show cross-sectional views for decoupling the metal silicide formation on the drain and source regions and on the gate electrode in accordance with still further illustrative embodiments of the present invention.

FIG. 4a schematically shows a semiconductor device 400 having a configuration similar to that shown in FIG. 2d. Additionally, the semiconductor device 400 comprises a dielectric layer 440, wherein a thickness of the dielectric layer 440 is selected so as to exceed a height of the gate electrode 408. The dielectric layer 440 may be comprised of silicon dioxide deposited by well-established CVD processes.

Figure 4B:
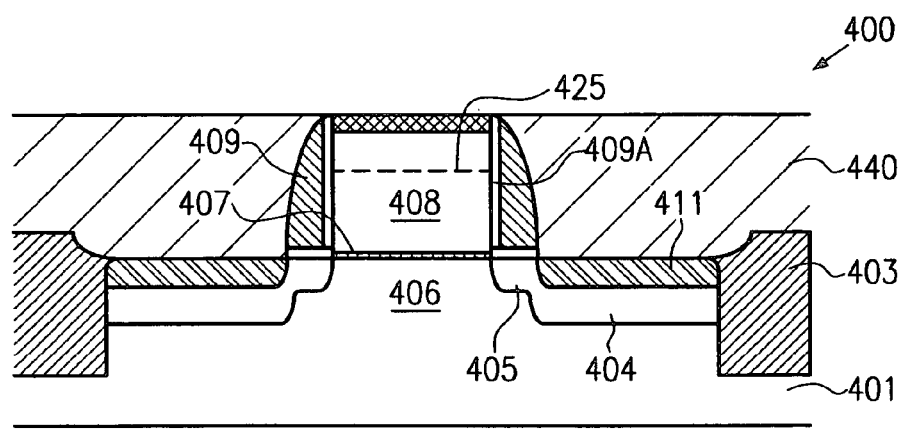

FIG. 4b schematically shows the device 400 after completion of a CMP process to remove excess material of the layer 440, wherein the CMP process may be stopped on or in the cap layer 420a. In one embodiment, a gate implantation sequence may be performed so as to modify the existing dopant profile 425 that has resulted from the implantation sequences for forming the drain and source regions 404 and the extension regions 405, in such a manner that the requirements for an optimum gate conductivity and a minimum gate depletion are achieved. As in the embodiments described with reference FIG. 3a, dopant penetration into the silicide regions 411 and/or the drain and source regions 404 is effectively reduced by the layer 440.

Figure 4C:
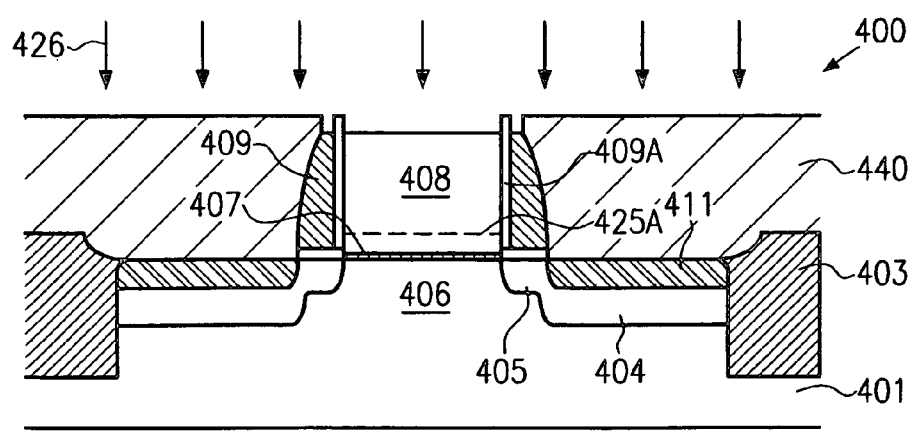

FIG. 4c shows the device 400 in accordance with yet another illustrative embodiment, wherein a selective etch process is performed so as to remove the cap layer 420a. Depending on the composition of the cap layer 420a and of the sidewall spacers 409, the height of the sidewall spacers may also be reduced during the selective etch process as is illustrated in FIG. 4c. Moreover, the gate implantation, indicated by 426, may be performed with the cap layer 420a removed or, as explained with reference to FIG. 4b, may have been performed prior to the removal of the cap layer 420a. Consequently, a corresponding gate dopant profile 425a is created that may meet the requirements for a desired gate behavior.

Figure 4D:
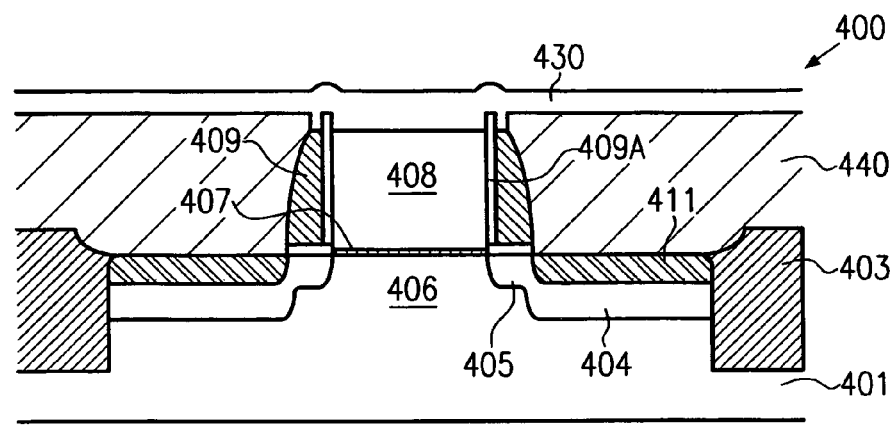

FIG. 4d schematically shows the device 400 with a nickel layer 430 formed thereon. Subsequently, a heat treatment may be performed so as to initiate a chemical reaction between the gate electrode 408 and the nickel layer 430 as is also described with reference to FIG. 2e.

Figure 4E:
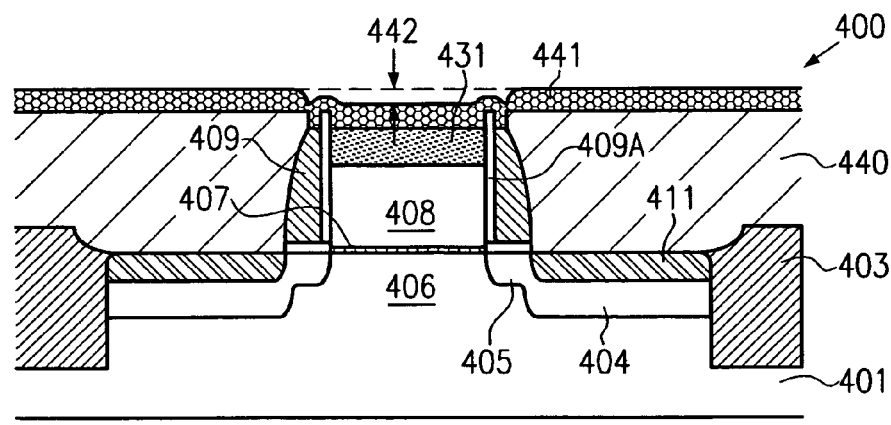

FIG. 4e schematically shows the device 400 with a corresponding nickel silicide region 431 formed on the gate electrode 408, wherein, additionally, an etch stop layer 441 is conformally deposited on the device 400. The etch stop layer 441 may be comprised of, for example, silicon nitride with a required thickness so as to reliably stop a subsequent contact hole etch process. It should be noted that a height difference 442 between the gate electrode 408 and the surrounding etch stop layer 441 results from the preceding removal of the cap layer 420a (see FIG. 4c) which may partially be compensated by the nickel silicide conversion during the formation of the nickel silicide region 431. Thus, the resulting height difference 442 may be adjusted by controlling the CMP process for planarizing the layer 440 and/or by an additional selective silicon etch after the top surface of the gate electrode 408 is exposed (see FIG. 4c). Subsequently, the device 400 is subjected to a CMP process to remove the etch stop layer 441 from the underlying dielectric layer 440, wherein the height difference 442 assures that the gate electrode 408 maintains covered by a portion of the etch stop layer 441.

Figure 4F:
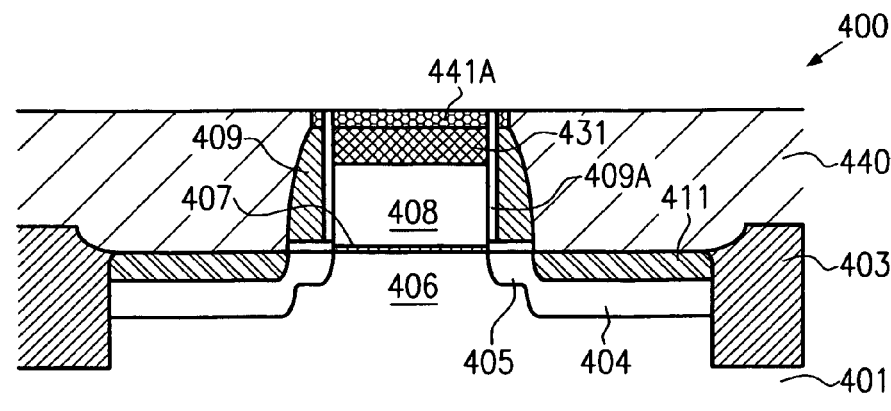

FIG. 4f shows the device 400 after completion of the CMP process with a residual etch stop layer 441a formed above the gate electrode 408. Subsequently, a further dielectric layer may be deposited with a required thickness and, thereafter, corresponding contact holes may be formed by well-established lithography and etch techniques, wherein the etch stop layer 441a assures a reliable stop at the gate electrode 408 during a common etch procedure in forming contact to the drain/source regions and the gate electrode. In case an etch stop layer may also be considered as necessary on the metal silicide regions 411, a corresponding etch stop layer (not shown) may be deposited prior to the deposition of the dielectric layer 440 (see FIG. 4a), and then further processing may be performed as described with reference to FIGS. 4b–4f.

As a result, the present invention allows independent formation of a gate silicide and drain and source silicide, wherein advantageously nickel silicide is used at the gate electrode and a cobalt disilicide is formed on the drain and source regions. Moreover, the gate doping and the drain and source doping may effectively be decoupled so as to provide superior gate characteristics while, nevertheless, a high degree of process compatibility with the standard process flow is maintained.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    patterning a polysilicon layer formed over a silicon-containing region of a substrate so as to obtain a polysilicon feature;
    forming a first metal silicide adjacent to said polysilicon feature while covering a top surface and sidewalls of said polysilicon feature;
    doping said polysilicon feature after forming said first metal silicide;
    exposing said top surface; and
    forming a second metal silicide in said polysilicon feature, said second metal silicide differing from said first metal silicide.

2. The method of claim 1, wherein patterning said polysilicon feature includes forming a cover layer on said polysilicon layer and forming said polysilicon feature by lithography and anisotropic etching, whereby a non-removed portion of said cover layer serves to cover said top surface during the formation of said first metal silicide.

3. The method of claim 2, further comprising adjusting optical characteristics of said cover layer so as to act as a bottom anti-reflective coating.

4. The method of claim 2, further comprising adjusting at least one of a composition and a thickness of said cover layer so as to hinder ion penetration into said polysilicon feature during a following ion implantation.

5. The method of claim 1, wherein said second metal silicide comprises nickel monosilicide.

6. The method of claim 5, wherein said first metal silicide comprises cobalt disilicide.

7. The method of claim 2, wherein said top surface is exposed by anisotropically etching said non-removed portion of said cover layer.

8. The method of claim 1, further comprising forming sidewall spacers to cover the sidewalls of said polysilicon feature.

9. The method of claim 5, further comprising forming doped areas adjacent to said polysilicon feature prior to forming said first metal silicide region.

10. The method of claim 9, wherein exposing said top surface includes an isotropic etch process.

11. The method of claim 9, further comprising doping said polysilicon feature prior to forming a nickel silicide region and after forming said first metal silicide.

12. The method of claim 11, further comprising forming an implantation mask above said first metal silicide.

13. The method of claim 12, further comprising forming an etch stop layer above said second metal silicide.

14. The method of claim 13, further comprising forming a dielectric layer above said polysilicon feature and said implantation mask, and forming contact holes to said first metal silicide and said second metal silicide.

15. The method of claim 5, wherein forming said nickel silicide region includes depositing a nickel layer, heating said substrate to initiate a chemical reaction between silicon and nickel, and selectively removing non-reacted nickel.

16. A method of forming a field effect transistor, the method comprising:
    forming a layer stack including at least a gate insulation layer, a polysilicon layer and a cap layer above a silicon region formed on a substrate;
    patterning said layer stack to form a gate electrode having a top surface covered by at least said cap layer;
    forming a drain and a source region adjacent to said gate electrode;
    forming silicide regions comprising a first metal in said drain and source regions;
    doping said gate electrode after forming said first metal silicide;
    exposing said top surface of said gate electrode; and
    forming a silicide region comprising a second metal in said gate electrode.

17. The method of claim 16, wherein said cap layer is formed so as to act as a bottom anti-reflective coating during patterning said layer stack.

18. The method of claim 16, further comprising forming sidewall spacers at sidewalls of said gate electrode.

19. The method of claim 18, wherein exposing said top surface includes performing an anisotropic etch process to remove material of said cap layer.

20. The method of claim 19, wherein exposing said top surface includes an isotropic etch process.

21. The method of claim 16, further comprising implanting a dopant species into said gate electrode prior to forming said second metal silicide region and after forming said first metal silicide region.

22. The method of claim 16, further comprising implanting a dopant species into said gate electrode prior to forming said first and second metal silicide regions.

23. The method of claim 16, wherein said first metal silicide region is comprised of cobalt disilicide.

24. The method of claim 23, wherein said second metal silicide region is comprised of nickel silicide.

* * * * *